Oct. 27, 1970 J. A. LUDVIK 3,536,961

WIRING DEVICE USING CHANNEL MEANS AS A BUS BAR

Filed Oct. 23, 1968

INVENTOR.
JOSEF A. LUDVIK
BY Woodling, Krost, Granger and Rust,
ATTORNEYS.

United States Patent Office 3,536,961
Patented Oct. 27, 1970

3,536,961
WIRING DEVICE USING CHANNEL MEANS AS A BUS BAR

Josef A. Ludvik, University Heights, Ohio, assignor to Reliance Electric Company, a corporation of Delaware Filed Oct. 23, 1968, Ser. No. 769,873
Int. Cl. H02b *1/20;* H02g *3/22*
U.S. Cl. 317—122 21 Claims

ABSTRACT OF THE DISCLOSURE

The wiring device disclosed is one which combines the functions of a wiring channel to contain and guide conductors as well as a bus bar to conduct current to electrical components. The wiring device is an elongated channel plus a cover which may easily be snapped in place and containing side apertures to permit conductors in the wiring channel to exit to be connected to electrical components. In addition a plurality of terminals such as wire wrap terminals are provided along the length of the channel so that electrical connection may be made thereto as a bus bar to supply electrical energy to the various electrical components. The cover and the U-shape channel together make the wiring channel which has a conductive surface to additionally act as an electrostatic shield for the conductors therein. The foregoing abstract is merely a resume of one general application, is not a complete discussion of all principles of operation or applications, and is not to be construed as a limitation on the scope of the claimed subject matter.

BACKGROUND OF THE INVENTION

The art of connecting and interconnecting electrical components has seen many forms and where many different conductors are used, for example, on a rack and panel mounting, it was common to lay these conductors side by side and tape them together or to lace them together into a type of cable with the various individual conductors branching off as necessary to connect to the electrical components. The lacing or taping was used to make a neater appearance as well as to provide some slight physical protection to the conductors. In cases where greater physical protection was desired, a U-shaped or similar shaped wiring channel was often provided as a trough in which the conductors were laid, generally loosely, and then held in place by some form of a cover. Apertures were generally provided along the length of the wiring channel to permit exit of any circuit conductor to connect to the electrical components. Wiring channels were generally neater in appearance than the cabling of the conductors and had the advantage of physical protection and slightly greater accessibility to the conductors by removing the cover; however, they have the disadvantage of greater bulk especially because bus bars usually were provided generally parallel to the wiring channels in order to supply electrical energy to the various electrical components. Also the problem was complicated because the wiring channel was generally grounded to the supporting frame for the electrical components and the bus bar must not be grounded against this frame or against the wiring channel. Thus cross-overs had to be established which were insulated and increased the cost of manufacture and installation of the separated wiring channels and bus bars.

The problem has been complicated in recent years due to the increased usage of solid state devices such as transistors, thyristors, diodes, etc. which require low voltage and when used in quantity require fairly high current. The problem has also been further complicated by the continued use of printed circuit cards which condense the electronic circuitry onto a small card, for example, six by ten inches which plugs into a multi-terminal socket and then these terminals on the sockets must be interconnected by many different conductors which are routed through the wiring channels usually on the back of the rack or supporting frame.

Accordingly, an object of the invention is to provide a wiring device which is a combined bus bar, wiring channel for conductors and electrostatic shield for the conductors.

Another object of the invention is to provide a wiring device which is an elongated member providing physical protection to conductors and which also acts as a conductor or bus bar for supplying electrical energy to electrical components.

Another object of the invention is to provide a wiring device which eliminates the formerly used separate wiring channels and bus bars.

SUMMARY OF THE INVENTION

The invention may be incorporated in a wiring device, comprising, in combination, an elongated member having a base wall and a first side wall, said first side wall and said base wall forming generally an L-shape in cross section, wiring channel means including said base and side wall of said elongated member for at least partially enclosing any conductors therein as a wiring channel, said wiring channel means having a plurality of leg portions having surfaces defining a plurality of apertures along the length of the wiring channel means, said apertures permitting conductors to exit from the interior to the exterior of said wiring channel, a plurality of terminals on said wiring channel means, and at least a part of said wiring channel means including said terminals being continuously electrically conductive along the length thereof as a bus bar.

DESCRIPTION OF THE PREFERRED EMBODIMENT

Figure 1:
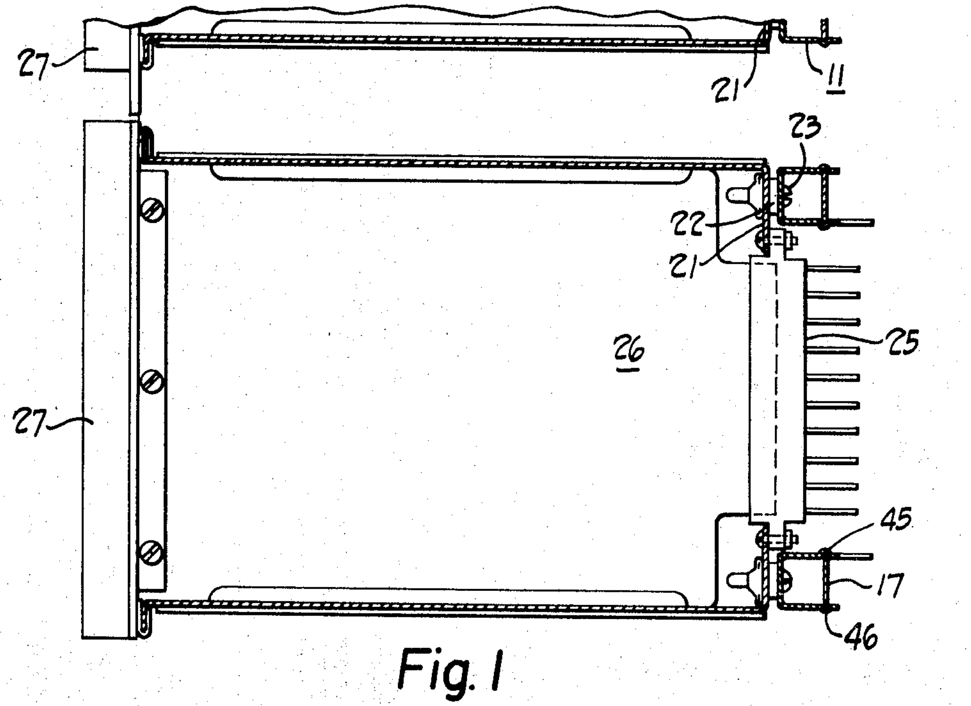
FIG. 1 is a side view of a support frame including a wiring device incorporating the invention.

The figures of the drawing illustrate the wiring device 11 which includes generally an elongated member 12 having a base wall 13 and a first side wall 14. These two walls are generally at right angles with each other and are unitary. In this preferred embodiment the elongated member 12 also includes a second side wall 15, also unitary with the base wall 13 so that these three walls form a U-shape member in cross section as viewed in FIGS. 1 and 3. This elongated member is adapted to cooperate with a cover 17 to substantially completely enclose any or a plurality of conductors 18 therein as a wiring channel. The base wall 13 is substantially solid although as shown in FIG. 4 it preferably has a plurality of apertures 20 therein to provide means to mount this channel member 12 to a supporting frame 21. This supporting frame may be a typical rack and panel or rack and chassis mounting or electrical components and is usually a metallic frame. Preferably the U-shape channel member 12 is mounted in an insulated manner to the supporting frame 21 as by an insulator nut 22 and a bolt or machinc screw 23.

Figures 2, 3, 4:
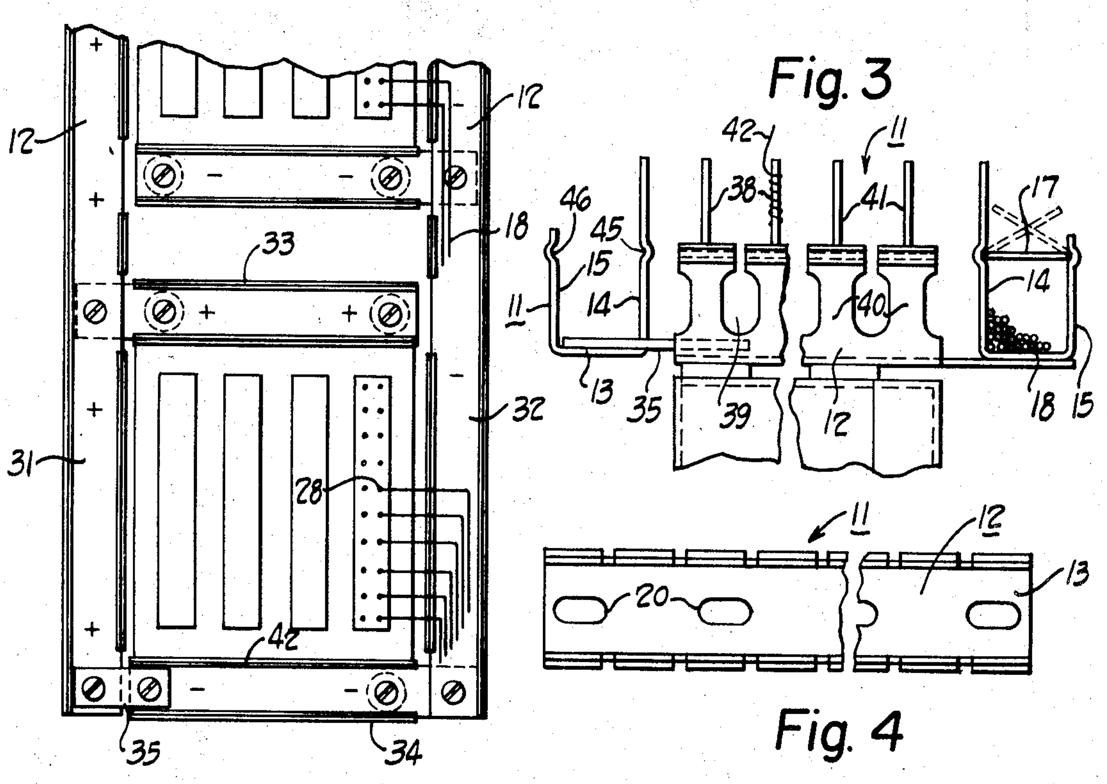
FIG. 2 is a rear view of the support frame.
FIG. 3 is a bottom view of the support frame.
FIG. 4 is a top view of the wiring device.

As shown in FIGS. 1, 2, and 3, two of the U-shaped channel members 12 are mounted on opposite sides of the supporting frame 21 in an insulated manner to serve as first and second bars, 31 and 32, respectively. These bus bars may be of positive and negative polarity, for example, to serve as bus bar conductors supplying electrical energy to electrical components 25 and 26 also carried in the supporting frame 21. The electrical components 25 may be a plurality of multi-terminal sockets or connectors to receive the plug-in devices such as printed circuit boards 26. Such circuit boards 26 may have handles 27 on the front thereof to be grasped to pull such circuit boards out of the sockets 25. The sockets 25 are fixed on the frame 21 and the plurality of conductors 18, passing through the wiring channel 11 are connected to the individual connections of the sockets 25 as shown at 28. The first bus bar 31 on the left side of FIG. 2 is electrically connected to a cross bus bar 33. Similarly the second bus bar 32 on the right side of FIG. 2 is electrically connected to a cross bus bar 34 near the bottom of this figure. An insulator support 35 may be used to interconnect the cross bus bar 34 and the first bus bar 31 for the support of the lower end thereof.

A plurality of terminals 38 are provided on the bus bars 31–34 and in this preferred embodiment are formed on the first side wall 14. Apertures 39 are also provided in the wiring device 11 to permit exit of the conductors 18 therein to be connected to the electrical components 25. In this preferred embodiment the apertures 39 are provided in the elongated member 12 and specifically in the first side wall 14. As better shown in FIG. 3, the two bus bars 31 and 32 on opposite sides of the frame 21 are preferably mounted so that the first walls 14 are closer adjacent to each other than the second walls 15. This is also true for the cross bus bars 33 and 34 which are horizontal in FIG. 2 and which lie generally crossways of the supporting frame 21. This permits the terminals 38 and apertures 39 to be closely adjacent the electrical components 25 and 26.

The apertures 39 are formed by wide leg portions 40 and narrow leg portions 41. These leg portions extend generally perpendicularly to the base wall 13 with the narrow leg portions being continuations of the respective wide leg portions. The wide leg portions 40 have surfaces defining the apertures 39 which may be termed conductor exit slots. The conductors may either exit or enter at these slots depending on use, but are herein termed conductor exit slots or apertures. The narrow leg portions 41 may be of any desired shape to provide the terminals 38 such as compression terminals, solder terminals, crimp terminals, tapped apertures to receive a screw or the like; but in this preferred embodiment have been illustrated as wire wrap terminals which are narrow straight bars of rectangular cross section. This is a popular form of terminal today wherein the conductor is simply stripped of its insulation and tightly wrapped around this terminal 38 with a wire wrapping tool. The sharp corners on the rectangular cross section dig into and make mechanical and electrical connection to the wire wrapped around it. One such connection is shown at 42 in FIGS. 2 and 3. This is the reason why the first side walls 14 are preferably placed closer adjacent each other, in order to facilitate connection to the electrical components 25 as well as to have the conductor exit slots 39 closely adjacent these electrical components.

FIGS. 1 and 3 illustrate that outwardly extending grooves 45 and 46 are provided in the first and second side walls 14 and 15, respectively, to receive the edges of the cover 17. FIG. 3 illustrates how this cover may be snapped into place from either side or additionally it may be slid in from the end. The elongated member 12, in order to serve as the bus bars 31–34, is continuously electrically conductive with the terminals 38. Accordingly the first side wall 14 has at least a surface which is continuously electrically conductive along the length thereof and which electrically connects to each of the terminals 38. This elongated member 12 may have a conductive surface or two conductive surfaces and preferably the entire elongated channel member 12 is made from electrically conductive material such as metal. It may be half hard or three-fourths hard copper or brass and will function quite satisfactorily as a bus bar cable of supplying large amperage requirements to the electrical components 25 and 26 despite the fact that it may be made from fairly thin gauge metal. This is because it has a fairly large total cross sectional area in the first and second side walls and the base wall. Cabling or lacing may be used to contain the conductors 18 in the U-shaped channel 12; however, it is preferred that the cover 17 be used for several reasons. One is that to change any of the conductors, the cover 17 may simply be snapped out of and into place because of the elasticity of the side walls 14 and 15. Also the cover 17 preferably has an electrically conducting surface such as being formed entirely of metal and it will then electrically contact the conductive surface of the channel member 12 so that in addition to acting as a channel and a bus bar, the wiring device also acts as an electrostatic shield. By making a continuous electrical conductor encircling the conductors 18, the electrostatic shield is formed despite the conductor exit slots 39 because the slots are only about one-fourth inch wide, for example, and the frequency would have to be higher than 30,000 mHz. to pass through these slots. This action of the wiring device 11 as an electrostatic shield is desirable in order to prevent spurious impulses reaching the conductors 18 which might have a degrading effect on the electrical components especially where they are digital circuit components. Also the cover 17 provides additional physical protection to the conductors 18. It will thus be seen that the wiring device 11 performs the triple function of a physical guide and protection to the conductors 18 to act as a wiring channel, which also acts as a bus bar to conduct electrical energy to the components 25 and acts as an electrostatic shield to the conductors 18.

Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and the scope of the invention as hereinafter claimed.

What is claimed is:

1. A wiring device, comprising, in combination:
an elongated member having a base wall and a first side wall,
said first side wall and said base wall forming generally an L-shape in cross section,
wiring channel means including said base and side wall of said elongated member for at least partially enclosing any conductors therein as a wiring channel,
said wiring channel means having a plurality of leg portions having surfaces defining a plurality of apertures along the length of the wiring channel means,
said apertures permitting conductors to exit from the interior to the exterior of said wiring channel,
a plurality of terminals on said wiring channel means,
a bus bar including at least a part of said wiring channel means being electrically conductive along the length thereof,
and means electrically connecting said terminals to said bus bar.

2. A wiring device as set forth in claim 1 wherein said base wall and said first side wall are a unitary part of said elongated member.

3. A wiring device as set forth in claim 1, including means to mount said base wall on a supporting frame.

4. A wiring device as set forth in claim 1, including means to mount two of said elongated member base walls on a supporting frame and insulated therefrom to form first and second bus bars of different polarities.

5. A wiring device as set forth in claim 1, wherein said wiring channel means includes an elongated cover cooperating with said elongated member to generally enclose any conductors therein.

6. A wiring device as set forth in claim 5, including an electrically conductive surface on said cover, and an electrically conductive surface on said elongated member contacting said conductive surface on said cover to complete an electrostatic shield for any conductors in said wiring channel means.

7. A wiring device as set forth in claim 1 wherein said plurality of terminals are on said elongated member.

8. A wiring device as set forth in claim 1 wherein said plurality of apertures are on said elongated member.

9. A wiring device as set forth in claim 1 wherein said plurality of terminals and said bus bar are a part of said elongated member sidewall.

10. A wiring device as set forth in claim 1, wherein said elongated member has a second side wall so that said first and second side walls each join to said base wall and form generally a U-shape in cross section.

11. A wiring device as set forth in claim 10, wherein said wiring channel means includes a flat metallic cover plate cooperating with said first and second side walls to form said wiring channel means substantially enclosing any conductors therein.

12. A wiring device as set forth in claim 10, including an outwardly extending groove near the outer edge of each of said first and second side walls substantially equally spaced from said base wall, and a flat cover engaged in said grooves and covering said U-shaped elongated member to contain any conductors therein.

13. A wiring device as set forth in claim 1, wherein said elongated member is formed of electrically conductive metal.

14. A wiring device as set forth in claim 1, wherein said apertures are slots extending from an outer edge of said first side wall toward said base wall to form conductor exit slots to permit conductors to exit from the interior to the exterior of said wiring channel means.

15. A wiring device as set forth in claim 1, wherein said leg portions form conductor exit slots in said first side wall,
said leg portions extending on said first side wall away from said base wall,
and said terminals being on at least some of said leg portions.

16. A wiring device as set forth in claim 1 wherein said apertures in said first side wall extend generally perpendicularly to said base wall and said leg portions include narrow legs extending generally perpendicularly to said base wall as wire wrap terminals for connection to said bus bar.

17. A wiring device as set forth in claim 4, including said terminals being on said first side walls, and said first side walls of each said first and second bus bars being disposed closest adjacent each other for proximity of said terminals on said first side walls closely adjacent electrical components carried on the supporting frame.

18. A wiring device as set forth in claim 1, wherein said leg portions include a wide leg portion and a narrow leg portion,
said apertures being conductor exit slots formed between said wide leg portions,
and said narrow leg portions forming said terminals.

19. A wiring device, comprising, in combination:
an elongated unitary metal conductive channel having a base wall and first and second side walls unitarily attached to said base wall,
said side walls and said base wall forming generally a U-shape member in cross section,
said base wall being substantially solid,
means to mount two of said channel base walls on a frame and insulated therefrom to form first and second bus bars of different polarities,
said first side wall of each of said channels disposed closest adjacent each other,
said first side wall having a solid portion, a plurality of wide leg portions and a plurality of narrow leg portions,
said wide leg portions forming conductor exit slots extending from an outer edge of said first side wall toward said base wall and permitting conductors to exit from the interior to the exterior of the channel,
said narrow leg portions forming wider slots which are continuations of the respective conductor exit slots,
said narrow leg portions forming wire wrap terminals for connection to said channel as a bus-bar,
an outwardly extending groove in each of said first and second side walls substantially equally spaced from said base wall,
and a flat metal cover strip engaged in said grooves and covering said U-shaped channel as a wiring channel to contain any conductors therein and complete an electrostatic shield together with said channel for any conductors therein.

20. A wiring device as set forth in claim 1, including shoulders on said leg portions defining a restriction to any conductors in said apertures.

21. A wiring device as set forth in claim 18, including shoulders on said wide leg portions generally at the entrance to said apertures to aid in retaining any conductors in said apertures.

References Cited

UNITED STATES PATENTS

| | | | |
|---|---|---|---|
| 2,140,376 | 12/1938 | Anderson | 175—298 |
| 2,363,327 | 11/1944 | Hodgkins | 175—371 |
| 2,921,607 | 1/1960 | Caveney | 138—75 |
| 3,152,219 | 10/1964 | Murray | 174—72 |

LARAMIE E. ASKIN, Primary Examiner

G. P. TOLIN, Assistant Examiner

U.S. Cl. X.R.

174—72